(12) United States Patent
Takekuma (10) Patent No.: US 6,432,199 B1
(45) Date of Patent: Aug. 13, 2002

(54) APPARATUS AND METHOD FOR PROCESSING A SUBSTRATE

(75) Inventor: Takashi Takekuma, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/553,889

(22) Filed: Apr. 20, 2000

(30) Foreign Application Priority Data

Apr. 30, 1999 (JP) .............................. 11-124104

(51) Int. Cl.$^7$ .............................. B05D 1/02; B05C 5/02
(52) U.S. Cl. .......................... 118/52; 118/56; 118/319; 118/320; 134/22.18; 134/104.1; 438/905
(58) Field of Search ............................ 118/52, 56, 319, 118/320; 134/1, 22.1, 22.18, 34, 104.1; 438/905; 427/240

(56) References Cited

U.S. PATENT DOCUMENTS 5,312,487 A     5/1994   Akimoto et al.
5,947,136 A  *  9/1999   Abras ........................ 134/104.1

FOREIGN PATENT DOCUMENTS

JP          7-66116        3/1995

* cited by examiner

*Primary Examiner*—Laura Edwards
(74) *Attorney, Agent, or Firm*—Fulbright & Jaworski L.L.P.

(57) ABSTRACT

An apparatus for processing a substrate by supplying a process liquid to a substrate to be processed in a photolithographic process, comprises a cup, a washing control plate for washing an inner surface of the cup, a spin chuck for rotating the washing control plate or the substrate while holding the washing control plate or the substrate substantially horizontally in the cup, a solvent supply mechanism for supplying a solvent capable of dissolving the process liquid, onto the washing control plate or the substrate held by the spin chuck, a process liquid supply mechanism for supplying the process liquid onto the substrate held by the spin chuck, and a control section for selecting either a solvent to be supplied to the substrate or a solvent to be supplied to the washing control plate and controlling the solvent supply mechanism in accordance with the solvent selected.

19 Claims, 8 Drawing Sheets

CONTROL SYSTEM FOR SOLVENT SUPPLY SYSTEM

APPARATUS AND METHOD FOR PROCESSING A SUBSTRATE

CROSS-REFERENCE TO RELATED APPLICATIONS

This application is based upon and claims the benefit of priority from the prior Japanese Patent Application No. 11-124104, filed Apr. 30, 1999, the entire contents of which are incorporated herein by reference.

BACKGROUND OF THE INVENTION

The present invention relates to an apparatus for processing a substrate characterized by supplying a process liquid such as a resist solution or a solvent onto a substrate such as a semiconductor wafer and a substrate for a liquid crystal display, and spreading the supplied process liquid by rotating the substrate in a cup. More specifically, the present invention relates to a method for washing the cup having the scattered process liquid attached thereon.

In manufacturing processes for a semiconductor device and liquid crystal display (LCD), etc., a photolithographic technique is used to form a desired circuit. In the photolithography technique, a resist solution is applied to a surface of the substrate such as a wafer, exposed to light together with a predetermined pattern, and subjected to a developing process. In this manner, a resist film having the predetermined pattern is formed on the substrate. Subsequently, the obtained resist film is subjected to etching, with the result that a circuit of the predetermined pattern is formed.

Today, a spin coating method is dominantly employed as a method of coating a resist solution onto a wafer. In the spin coating method, after a resist solution is supplied dropwise to a center of the wafer, the wafer is rotated at a high speed to apply centrifugal force to the resist solution. As a result, the resist solution is spread and coated over the entire surface of the wafer. At this time, excessively provided resist solution is removed by scattering it from the edge of the wafer by the centrifugal force. In the spin coating method, to receive the resist solution scattered from the wafer, the wafer is rotated within the cup. However, in this method, the resist solution scattered from the wafer is attached to an inner wall of the cup. Therefore, the cup must be washed occasionally as needed.

A technique for washing the process liquid attached to the inner wall of the cup is disclosed in U.S. Pat. No. 5,312,487. In the technique disclosed in the publication, a plate for distributing washing liquid exclusively used in washing process is employed. The plate is first loaded into a cup to be washed and held on the spin chuck. Then, the plate is rotated at a high speed. Subsequently, a washing liquid is supplied from the washing liquid supply nozzle which is placed right above the plate rotated at a high speed so as to face the plate. The supplied washing liquid is distributed and scattered from the edge portion of the plate by the centrifugal force produced by the rotation of the plate and blown onto the inner portion of the cup.

However, the aforementioned conventional technique has the following problems.

First, the conventional apparatus has a discrete solvent supply mechanism for supplying the washing liquid to the cup. Therefore, an entire structure of the apparatus is inevitably complicated and enlarged.

In addition, various types of the process liquids (for example, resist solution) have been increasingly used in recent years. With this tendency, stains formed on the cup are diversified in pattern. Never-theless, stains of various types of process liquids cannot be cleaned by the technique disclosed in the publication. To describe more specifically, the cup cannot be sufficiently cleaned in the cases where a hard-to-remove process liquid is used and where a low-viscosity process liquid is scattered over a broad range. To deal with this problem, the amount of washing liquid and the number of washing process must be increased. As a result, throughput is inevitably reduced.

In these circumstance, it is an object of the present invention to provide a substrate processing apparatus for washing out an attached material from the cup without making the apparatus complicated and enlarged.

Furthermore, the present invention is directed to a substrate processing method for efficiently washing an inner surface of the cup in the photolithography.

BRIEF SUMMARY OF THE INVENTION

According to the present invention, there is provided an apparatus for processing a substrate by supplying a process liquid to a substrate to be processed in a photolithography, comprising a cup; a washing control plate for washing an inner surface of the cup; a spin chuck for rotating the washing control plate or the substrate while holding the washing control plate or the substrate substantially horizontally in the cup; a solvent supply mechanism for supplying a solvent capable of dissolving the process liquid, onto the washing control plate or the substrate held by the spin chuck; a process liquid supply mechanism for supplying the process liquid onto the substrate held by the spin chuck; and a control section for selecting either a solvent to be supplied to the substrate or a solvent to be supplied to the washing control plate and controlling the solvent supply mechanism in accordance with the solvent selected.

In this case, the control section has a supply-condition data storing portion for storing data of supply conditions of the solvents to the substrate and the washing control plate; and the control section controls the solvent supply mechanism on the bases of each of the supply condition data stored in the supply-condition data storing portion. Furthermore, it is desirable that the supply conditions for the solvent to be supplied to the washing control plate be determined in consideration of the process liquid.

The solvent supply mechanism has a solvent supply source, and a solvent feeding mechanism connected to the control section which controls a supply amount and/or supply time of the solvent from the supply source.

The solvent supply mechanism has an upper surface side supply system for supplying the solvent toward an upper surface of the washing control plate and a lower surface side supply system for supplying the solvent toward the lower surface of the washing control plate; and the control section controls so as to supply the solvent to the washing control plate by at least one of the upper surface side supply system and the lower surface side supply system.

The solvent supply mechanism has a solvent supply system for supplying the solvent to at least one of the upper and lower surfaces of the washing control plate, and a solvent spray system for supplying a misty solvent toward an inner surface of the cup; and the control section supplies the misty solvent to an inner surface of the cup from the solvent spray system and thereafter supplies the solvent from the solvent supply system while the washing control plate is rotated.

The apparatus further comprises an atmosphere control mechanism for controlling an atmosphere of the cup, the atmosphere control mechanism being selectively controlled by the control section during a pre-processing time, processing time and a cup washing time.

The control section changes a rotation speed of the spin chuck to change a solvent supply position to the cup from the washing control plate.

The apparatus of the present invention further comprises a transfer mechanism for transferring the washing control plate onto the spin chuck.

The washing control plate further comprises a solvent guiding portion for scattering the solvent.

The solvent guiding portion has a guiding piece which is formed by partly cutting a peripheral portion of the washing control plate to make an incision and raising up the incision.

The solvent guiding portion has a guiding passage for guiding the solvent from a surface to which the solvent is supplied to an opposite surface thereof.

The apparatus of the present invention further comprises a substrate temperature control mechanism for setting temperatures of the washing control plate and the substrate substantially the same.

The spin chuck adsorbs and holds the washing control plate or the substrate at a predetermined distance therebetween.

According to the present invention, a method of processing a substrate by supplying a process liquid to the substrate in a cup in a photolithography, comprising the steps of:

(a) permitting the substrate to be held on a spin chuck arranged in the cup;

(b) moistening the substrate with the solvent by supplying a solvent onto the substrate by a solvent supply system while the substrate is rotated by the spin chuck;

(c) forming a film of a process liquid on the substrate by supplying a process liquid onto the substrate while rotating the substrate by the spin chuck;

(d) removing the substrate from the spin chuck and mounting a washing control plate onto the spin chuck; and (e) supplying the solvent onto the washing control plate by using the same solvent supply system as in the step (b) while the washing control plate is rotated by the spin chick to scatter the solvent from the washing control plate toward an inner surface of the cup, thereby removing an attached material from the inner surface of the cup.

In the step (e), another solvent supply system is desirably used which differs from the solvent supply system used in the step (b).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferred embodiments of the present invention will be explained with reference to the accompanying drawings. In this embodiment, a substrate processing apparatus, more specifically, a cup washing system, is applied to a resist solution coating apparatus for coating a photoresist solution onto a semiconductor wafer.

Figure 1:
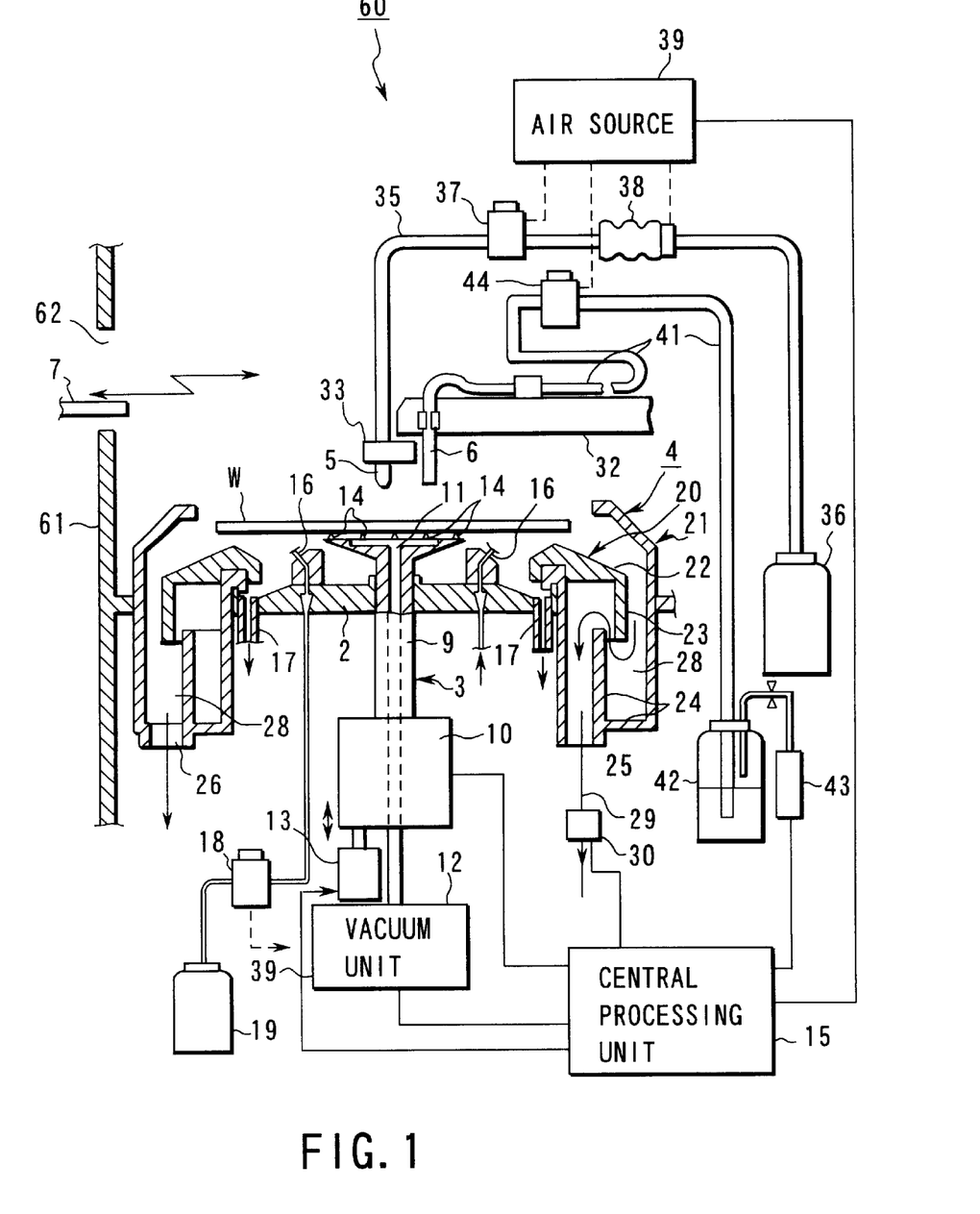
FIG. 1 is a sectional view of an apparatus for processing a substrate according to an embodiment of the present invention, with a block diagram of peripheral elements.

As shown in FIG. 1, a substrate processing apparatus 60 comprises a base 2, spin chuck mechanism 3, cup 4, resist solution supply nozzle 5, solvent supply nozzle 6, and washing control plate 100. The spin chuck 9 of the spin chuck mechanism 3 is rotatably and liftably supported by the base 2. The cup 4 is arranged so as to surround a semiconductor wafer W adsorbed and held by the spin chuck 9. The nozzles 5 and 6 are held by an arm 32 of a common moving mechanism 54 so as to move together between a home position to an operational position.

The substrate processing apparatus 60 is surrounded by a case 61. They are integrally formed as one unit. A loading/unloading port 62 is formed in a side surface of the case 61. The wafer W is loaded into the substrate processing apparatus 60 through the loading/unloading port 62 by a main arm mechanism 7. Alternatively, a washing control plate 100 is taken out by the main arm mechanism 7 from a storage section 102, which is arranged outside the unit 60, and loaded into the unit 60. In brief, the wafer W and the washing control plate 100 are selectively loaded into the spin chuck mechanism 3 by the main arm mechanism 7.

Now, individual mechanisms will be explained more specifically.

The spin chuck mechanism 3 has a spin chuck 9, a servo motor 10 for rotating the spin chuck 9 and a cylinder mechanism 13 for moving the spin chuck 9 up and down. The spin chuck 9 has a vacuum chuck groove 11 in its upper surface. The vacuum chuck groove 11 passes through inside the shaft of the spin chuck 9 and is connected to a vacuum mechanism 12.

When the vacuum mechanism 12 is actuated, the wafer W or the washing control plate 100 is adsorbed and held on the spin chuck 9. When the servo motor 10 is actuated, the wafer or the washing control plate 100 adsorbed and held by the spin chuck 9 can be rotated.

Minute projections 14 are arranged on the upper surface of the spin chuck 9 in a scattered fashion so as to give a predetermined space between the wafer W and the spin chuck 9. With this structural arrangement, atmospheric-condition controlled air around the wafer W flows to the lower surface side of the wafer W. The height of the projection 14 is set at a certain size which allows the wafer W securely adsorbed on the spin chuck 9 by the air flow passing between the spaces of the projections 14.

The motor 10 and the vacuum mechanism 12 are connected to a central process unit 15. The spin chuck mechanism 3 is actuated upon receipt of instructions from the central process unit 15.

On the other hand, a back rinse nozzle 16 is arranged on the base 2 for spraying a solvent, thinner, toward a rear surface of the wafer W or the washing control plate 100. The back rinse nozzle 16 is connected to a solvent supply source 19 via a control valve 18. A plurality of drainage pipes 17 are provided in the peripheral edge portion of the base 2, so that an unnecessary resist solution or solvent received on the base 2 can be discharged.

The cup 4 is constituted of an inner cup 20 and an outer cup 21. The inner cup 20 is fitted on the base 2. The outer cup 21 is arranged so as to cover the outside of the inner cup 20. The inner cup consists of an inclined portion 22 and the separation board 23. The inclined portion 22 is downwardly and outwardly inclined so as to gradually reduce the height toward the outside. The inclined portion 22 guides an unnecessary solution downward. The separation board 23 is connected to the inclined portion 22 and extended almost perpendicularly downward. The outer cup 21 is arranged around the inclined portion 22 and the separation board 23 of the inner cup 20 so as to surround them. The outer cup 21 consists of an outer wall portion 24 and an exhaust port 25. The outer wall portion 24 and the separation board 23 constitute a U-shape (cross section) gas/liquid passage 28. The exhaust port 25 is arranged within the outside wall portion 24. The exhaust port 25 is responsible for discharging an exhaust gas from the U-shape gas/liquid passage 28 downwardly from the cup. It should be noted that a discharge port 26 is formed at a bottom of the U-shape gas/liquid passage 28.

In the structure mentioned above, liquid and gas are separated by the separation board 23. Therefore, the liquid is discharged form the discharge port 26 arranged at the bottom of the gas/liquid passage 28, whereas the gas is exhausted from the exhaust port 25. On the other hand, an auto damper 30 is arranged in the middle of an exhaust pipe 29 connected to the exhaust port 25. The auto damper 30 controls the initiation/termination of the discharge of the atmosphere from the cup 4 upon receipt of the instructions from the central process unit 15.

The nozzles 5 and 6 are held by the arm 32 provided right above the spin chuck mechanism 3 and the cup 4 so as to face them. The resist solution supply nozzle 5 is detachably attached to the arm 32 via a holder 33. The nozzle 5 may be replaced by another nozzle 5a shown in FIG. 2.

The nozzle 5 is connected to a resist solution supply tank 36 by way of a supply pipe 35 whose temperature is controlled by a temperature control mechanism (not shown). A resist solution supply valve 37 and a pump 38 (e.g. bellows pump) are further provided in the middle portion of the supply pipe 35. The valve 37 and pump 38 are actuated by air supplied from an air source 39. The air source 39 is connected to the central process unit 15. Upon receipt of the instruction from the control unit 15, the air source 39 initiates suction of the resist solution from the tank 36 and supplies it onto the wafer W through the nozzle 5.

The solvent supply nozzle 6 is immobilized onto the arm 32. The upstream side of the solvent supply nozzle 6 is extended toward a proximal end and serves as a solvent supply pipe 41, and then connected to the solvent supply tank 42. To the solvent supply tank 42, a nitrogen gas supply source 43 is connected. Since pressurized nitrogen gas is introduced from the gas supply source 43 into the tank 42, a solvent is sent by pressure toward the nozzle 6. Since the nitrogen gas supply source 43 is connected to the central process unit 15, the nitrogen gas supply source 43 is operated upon receipt of instructions from the CPU 15. Furthermore, a solvent control valve 44 is connected in the middle portion of the solvent supply pipe 41. The solvent control valve 44 is opened and shut by the air introduced from the air supply source 39.

Furthermore, when the nitrogen gas supply source 43 and the air source 39 are operated by the instruction from the central process unit 15, the solvent within the tank 42 is pressurized, fed into the solvent supply pipe 41, and discharged from the nozzle 6 by the open/shut movement of the control valve 44.

Figure 2:
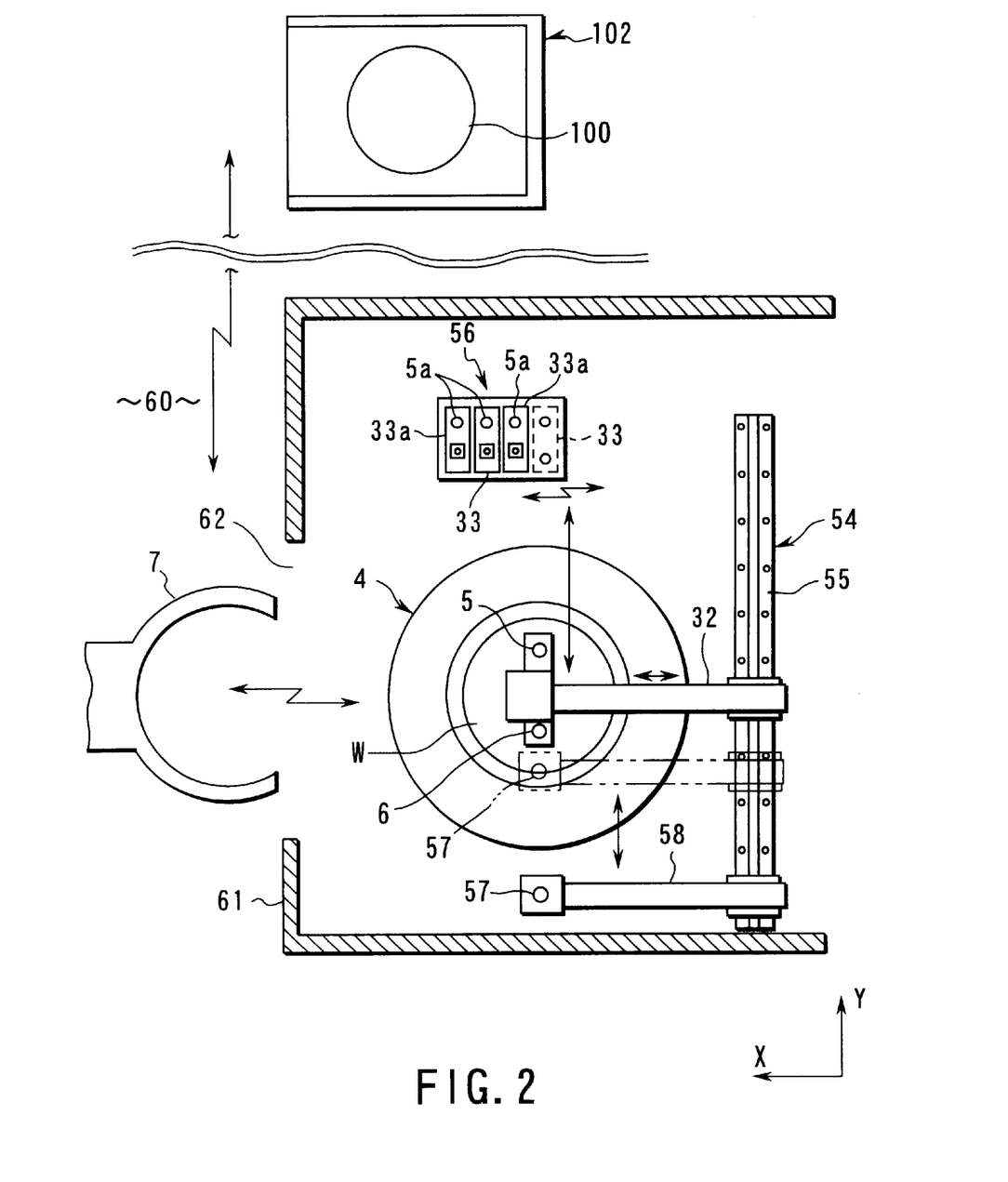
FIG. 2 is a plan view of the apparatus for processing a substrate according to the embodiment of the present invention.

As shown in FIG. 2, the arm 32 holding the nozzles 5 and 6, is held by a Y-axis driving mechanism 54. The Y-axis driving mechanism 54 has rails 55 extended over the cup 4 along a Y-axis direction. The nozzle 5 is movably provided between a position facing to the wafer W and a nozzle stand-by portion 56.

The nozzle stand-by portion 56 houses three nozzles 5a held by a holder 33a. The nozzles 5a are connected respectively to resist solution tanks (not shown) which store different types of resist solutions. The nozzle 5 now held by the arm 32 can be replaced with the nozzle 5a. Accordingly, 4 types of resist solutions can be selectively supplied in this embodiment. Furthermore, the nozzle stand-by portion 56 moves each nozzle 5a in an X-axis direction to position the nozzle 5a so as to face a distal end portion of the arm 32.

Furthermore, a side rinse nozzle 57 is shown in FIG. 2. The side rinse nozzle 57 is held by the arm 58 and positioned so as to face the wafer W. The side rinse nozzle 57 supplies a solvent only to a peripheral portion of the wafer W to dissolve and remove an unnecessary resist solution film.

Furthermore, in FIG. 2, a washing control plate storage unit 10 for storing the washing control plate 100 is shown The washing control plate 100 stored in the storage unit 102 is transferred by the main arm 7 through the temperature-controlled transfer passage 60. The washing control plate 100 is transferred onto the spin chuck 9 in place of the wafer W when the cup is washed.

Figure 3:
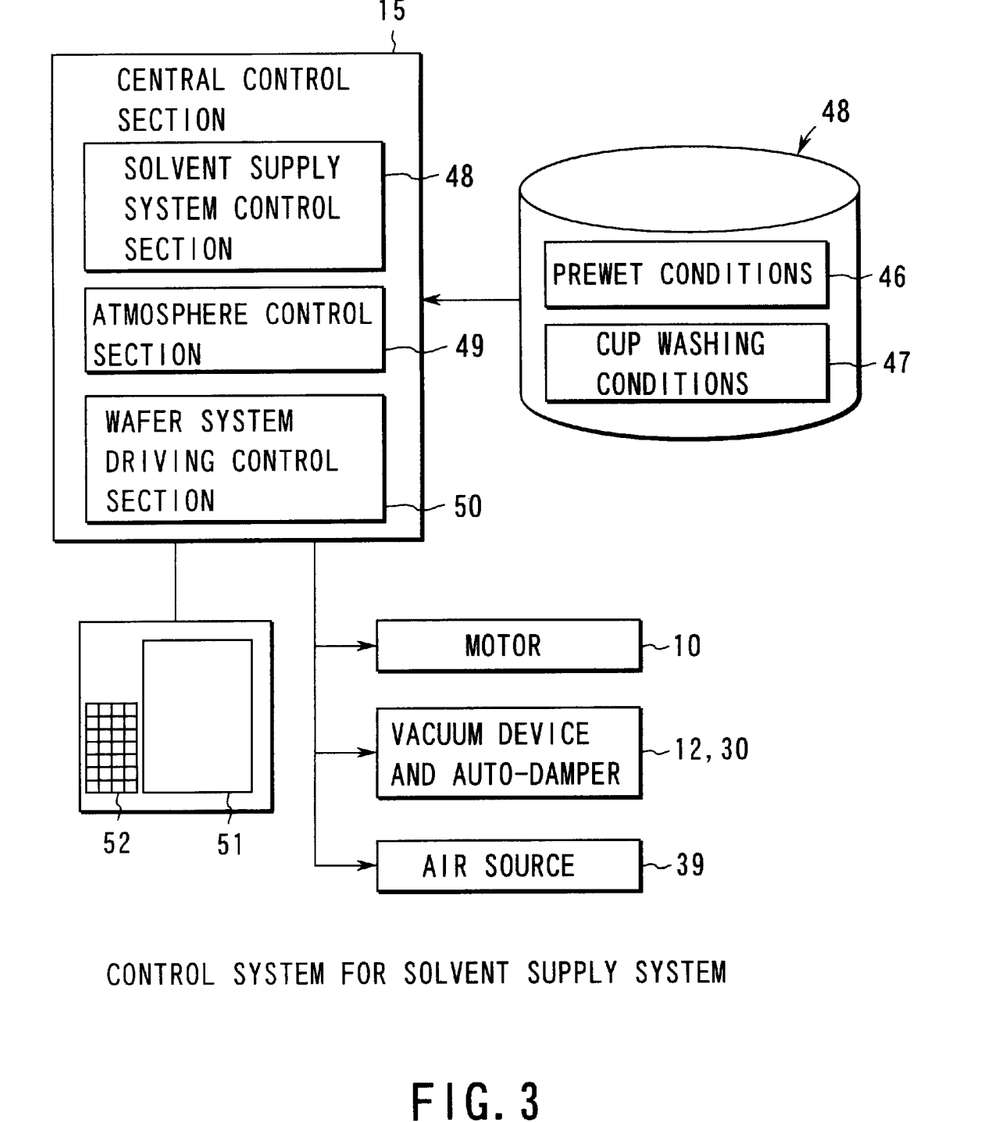
FIG. 3 is a block diagram showing a control unit of a solvent supply system.

Next, referring to FIG. 3, we will explain a gist portion of the present invention, that is, a control system of the solvent supply system.

In this system, a solvent supply system shown in FIG. 1 (6, 41, 42, 43, 44) is commonly used as a solvent supply system for a prewet process and as a solvent supply system for a washing process of the cup. Since both systems are selectively used, the control unit 15 according to this embodiment has a data storage unit 45 for storing data of prewet conditions 46 and data of cup washing conditions 47.

The prewet condition data 46 and the cup washing condition data 47 include various control data previously prepared in connection with individual resist solutions (4 types in this embodiment). These control data include data of a supply amount and a supply speed of the solvent depending upon a coating resist solution, atmosphere, wafer rotation speed, thickness, thickness distribution of a resist solution film to be formed, and the like.

The control unit 15 has a supply system control section 48, an atmosphere control section 49 and a wafer driving system control section 50. The supply system control section 48 controls a solvent supply system (air source and N2 supply source) in accordance with the conditions 46, 47. The atmosphere control section 49 controls the atmosphere around the spin chuck mechanism 3 by means of evacuation, down flow, or the like. The wafer driving system control section 50 controls a rotation driving system (spin chuck mechanism and the like) of the wafer W.

In a prewet step, the supply system control section 48 controls the control valve 44 through the air source 39 on the basis of the prewet conditions 46, thereby setting a supply time or supply speed of the solvent to be used in the prewet step appropriately corresponding to the type of the resist solution to be used. In the cup washing step, the washing condition data 47 are taken out, the supply time or supply speed of the solvent to be used in the cup washing step is set appropriately corresponding to the type of the resist solution to be used.

When the solvent is supplied with the aid of a pressurized nitrogen gas as shown in this embodiment, the solvent is supplied at a constant amount per unit time. Therefore, the solvent is supplied in accordance with each of the conditions by controlling the opening degree and/or opening time of the control valve 44. The atmosphere control section 49 controls a down-flow generating unit (DF)(not shown), the auto damper 30, and the vacuum unit 12 depending upon the prewet conditions and washing conditions to set atmosphere (temperature, moisture) around the substrate suitable for use in the prewet step or washing step. The wafer driving system control section 50 controls the motor 10, thereby setting a suitable rotation number of the wafer W for each step.

To the control unit 51, a display 51 and an input unit 52 such as a touch panel or a keyboard are further connected. It is therefore possible to display each of conditions 46 and 47 and to change or renew each of the conditions. For example, if the cup 4 is not washed satisfactorily under the set conditions, the conditions may be changed by increasing the amount of the solvent or the rotation number of the wafer W.

Figure 4A:
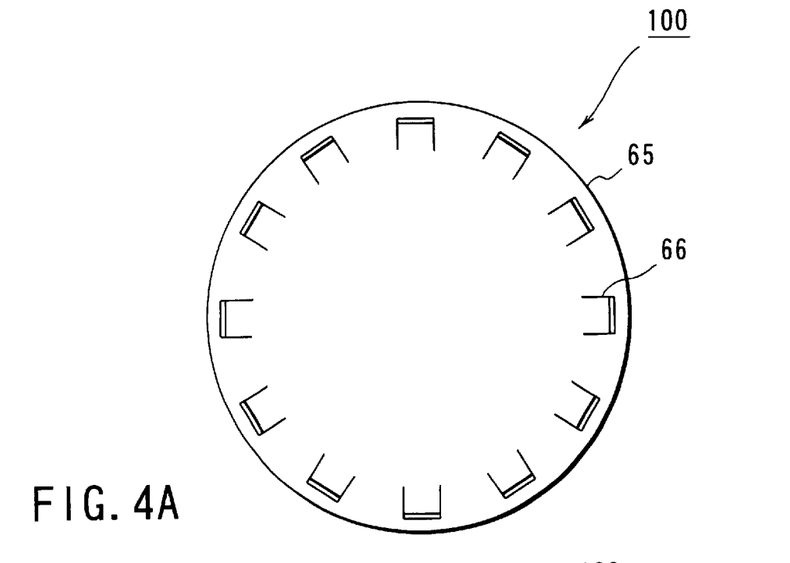
FIG. 4A is a plan view of and FIG. 4B is a longitudinal sectional view of a washing control plate.
Figure 4B:
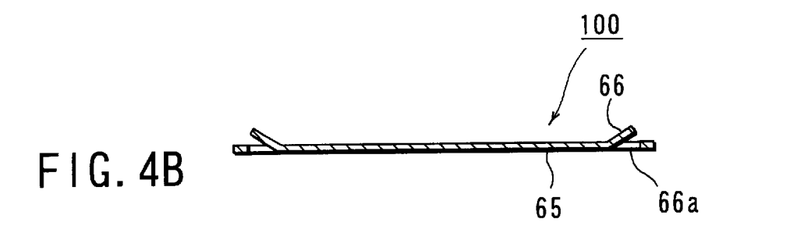

Now, referring to FIGS. 4A and 4B, the washing control plate 100 will be explained.

The washing control plate 100 has a disk-shape main body 65. The main body 65 is formed of the same material having the same heat conductivity and in the same thickness tc. Thus, the washing control plate 100 is controlled so as to have the same heat capacity as that of the wafer W.

The main body 65 has lift-up fins 66 (solvent guiding portion) arranged at predetermined intervals along the circumference direction. Each of the fins 66 is formed by forming a U-shape incision in the main body 65 and lifting up so as to gradually raise outwardly.

Figure 5:
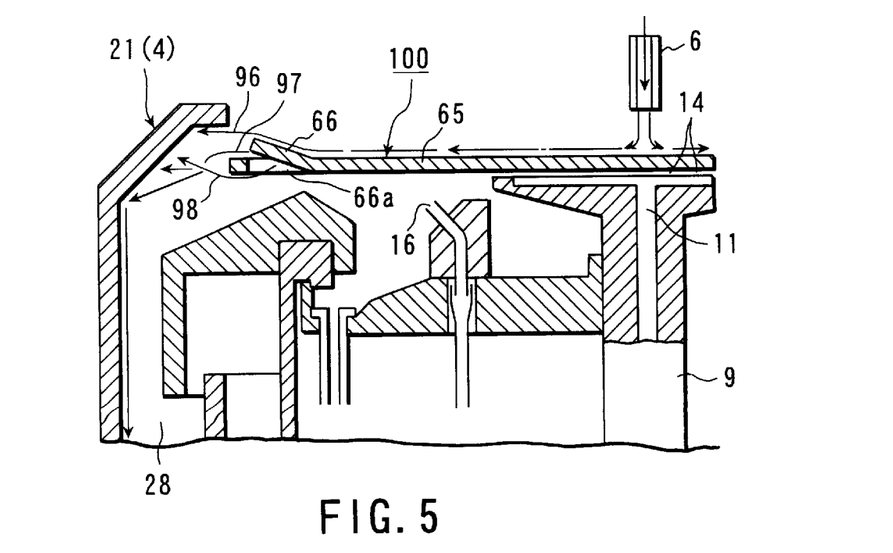
FIG. 5 is a sectional view showing the washing control plate and a cup, for explaining how to supply the washing liquid.

As shown in FIG. 5, the washing control plate 100 is rotated while it is adsorbed and held on the spin chuck 9, in the same manner as in the wafer W. When a solvent is supplied under the cup washing conditions 47 the solvent is guided along the radius outwardly by centrifugal force. The solvent guided along the radius outwardly is branched into a portion having the fin 66 and a portion having no fin 66. The solvent 96 guided by the pin 66 is further guided upwardly along the fin 66 and distributed and scattered from the edge portion of the fin 66 in an oblique-upward direction. Whereas, the solvent 97 guided by the portion having no fin 66 is scattered from the edge portion of the upper surface of the main body 65 almost horizontally. A part of the solvent guided to the portion having no fin 66 flows into a rear surface of the main body 65 through an opening 66a formed under the fin 66 and scattered from an edge of the lower surface of the main body 65, almost horizontally. The solvent 96, 97, 98 scattered from the upper and lower surfaces of the main body 65 are merged immediately after scattered from the edge portion of the main body 65. This phenomena disturbs the flow, with the result that the flow is scattered vertically in a wider range.

In this way, the solvents 96, 97, 98 scattered from the edge portion of the main body 65 or the fins 66 of the washing control plate 100 are directly blown to an inner surface of the cup 4 (outer cup 21) and dissolve and washes out the resist solution attached onto the cup 4. According to the washing control plate 100 of this invention, the solvent can be scattered in a wider range, so that a larger area can be washed.

Now, referring to FIGS. 6 and 7A to 7D, we will explain how to coat the resist solution in this embodiment.

(1) Preparatory Step

First, when the resist solution is selected, various settings are made through the input portion 52 shown in FIG. 3. Based on the settings, it is determined which type of nozzle 5 (resist solution supply system) should be picked up from the stand-by unit 56.

Figure 7A:
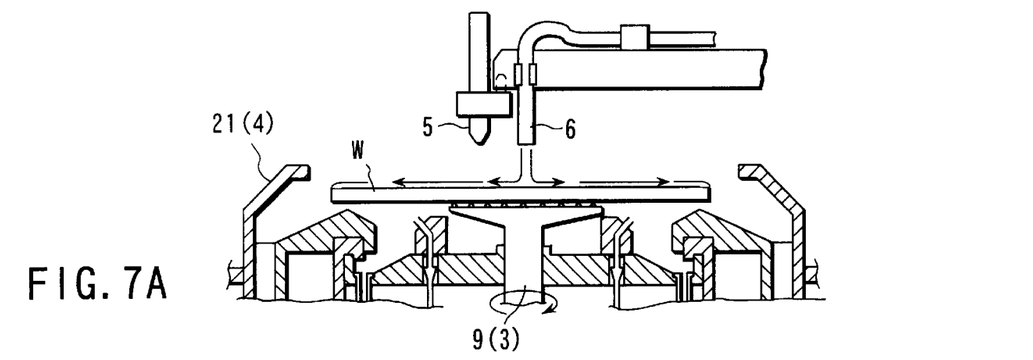
FIGS. 7A to 7D are schematic sectional views of apparatuses for processing a substrate for explaining the resist solution coating process and the cup washing process.

(2) Prewet Step (Steps S1 to S5, FIG. 7A)

First, the wafer W is mounted on the spin chuck 9 by the main arm mechanism 7 (Step S1). On the other hand, the control unit 15 takes out the prewet condition data 46 from the data storage section 45 (Step S2). Next, the nozzle 6 is moved to above the center portion of the wafer W so as to face the wafer W (Step S3, FIG. 7A). The control valve 44 connected to the nozzle 6 is controlled based upon the prewet conditions 46 corresponding to the resist solution to be coated. The solvent is supplied onto the wafer W in an amount of, for example, 2 ml(first amount) (Step S4).

Then, rotation of the wafer W is initiated. While the wafer W is rotated at 2000 rpm under the prewet conditions 46, the solvent is spread by centrifugal force to form a solvent film (Step S5).

By virtue of the prewet process, the resist solution becomes easy to spread over the wafer. Therefore, the resist solution, even if used in a small amount, can be spread over the entire surface of the wafer W. The consumption of the resist solution can be dramatically reduced.

Figure 7B:
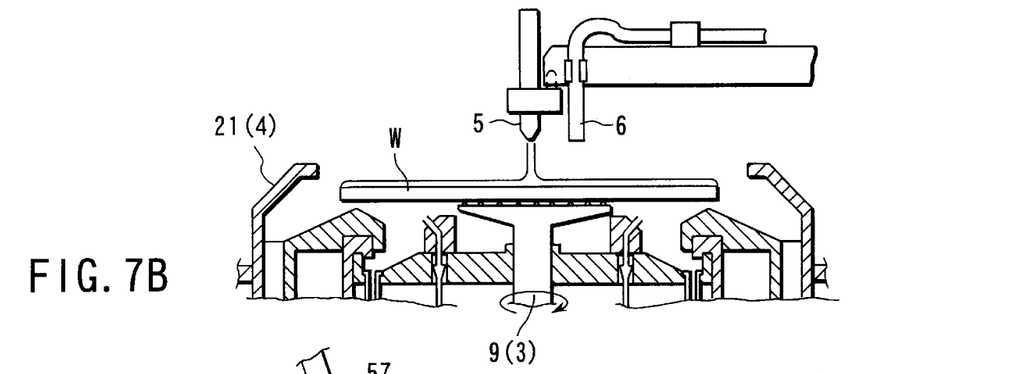
Figure 7C:
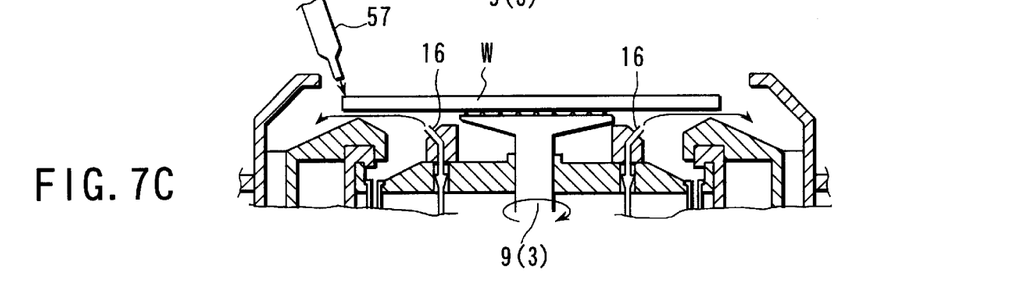

(3) Resist Solution Coating Step (Steps S6–S10, FIGS. 7B and 7C)

When the prewet step mentioned above is completed, the resist solution supply nozzle 5 is moved to above the center portion of the wafer W (Step S6, FIG. 7B). The resist solution is supplied in a predetermined amount while the wafer W is rotated at about 4000 rpm (Step S7). Thereafter, the rotation number of the wafer W is reduced to, for example, 1500 rpm to reduce the centrifugal force applied onto the resist film. As a result, it is possible to prevent an increase in thickness of the resist film at a peripheral portion of the wafer W (Step 8). Subsequently, the rotation number of the wafer W is increased to, for example, 3000 rpm to dry up the resist film (Step S9).

When the resist film is formed on the upper surface of the wafer W, a rear surface of the wafer W is washed to remove an unnecessary resist film from the wafer peripheral portion (Step S10). More specifically, as shown in FIG. 7B, the solvent is supplied from the back rinse nozzle 16 toward the rear surface (lower surface) of the wafer W while the wafer W is rotated. In this way, the solvent moves around from the upper surface to the rear surface to remove the resist film attached to the rear peripheral portion of the wafer W. On the other hand, the side rinse nozzle 57 is placed so as to face an upper surface peripheral portion of the wafer W. In this way, the resist film of the peripheral portion is dissolved and removed by the solvent supplied from the nozzle 57.

Note that the side rinse nozzle 57 is formed into a taper so as to accurately supply the solvent to a predetermined position. Therefore, it is possible to efficiently remove an unnecessary resist film even with a small amount of the solvent.

After the unnecessary resist solution film is removed, the wafer W is rotated at a high speed to shake off the solvent. In this way, a series of the resist solution coating steps are completed. The processed wafer is unloaded by the main arm mechanism 7 and transferred to the following post bake unit.

Figure 6:
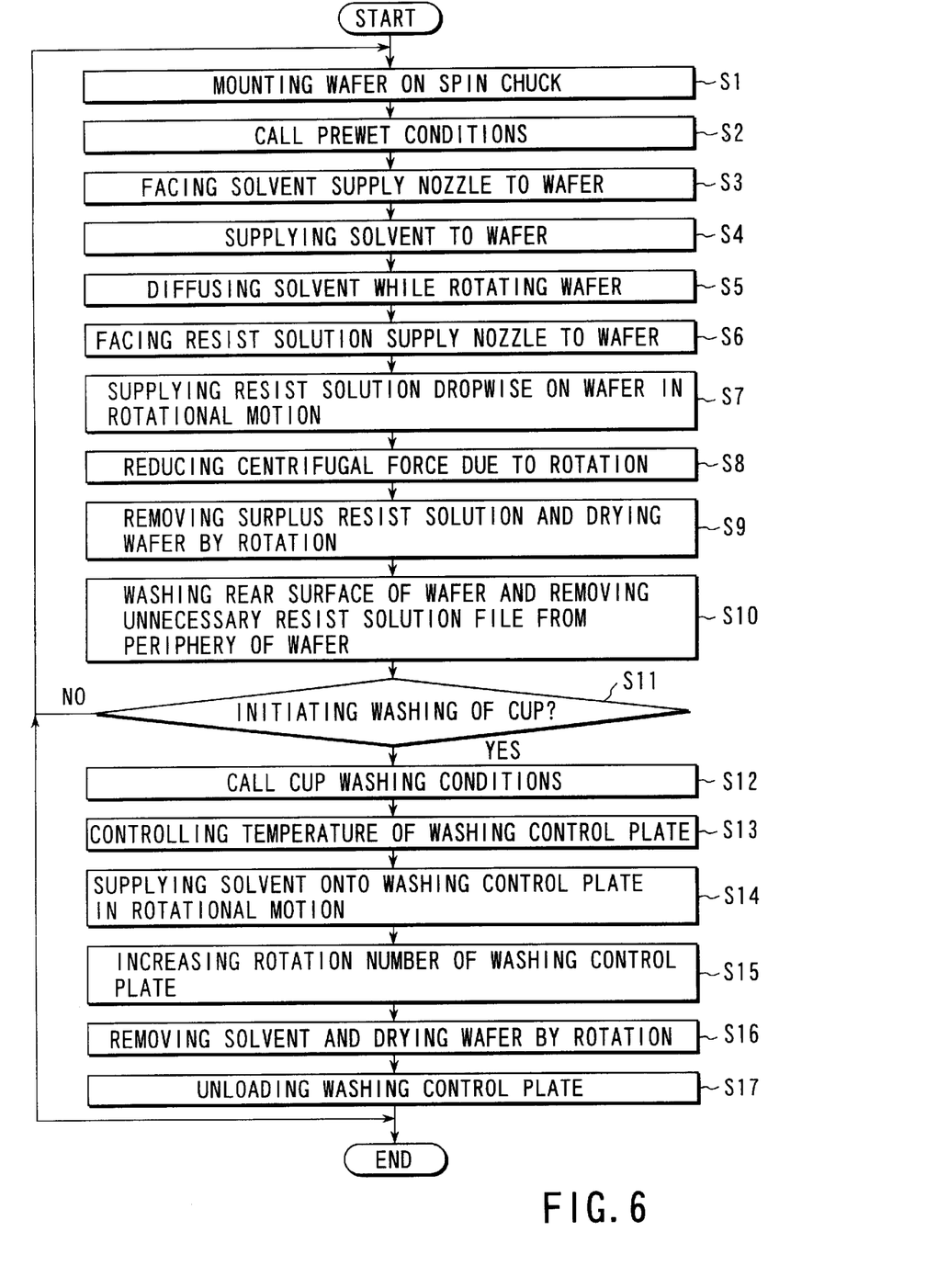
FIG. 6 is a flow chart for a resist solution coating process and a cup washing process.

Then, in the step S11, determination is made as to whether or not the washing of the cup is started. The determination is based upon how many times the resist solution is coated onto the wafer W. Until the determination is made in the step S11, steps S1 to S10 are repeated to coat the resist solution onto the wafer W, continuously.

Note that, in the resist solution coating step mentioned above, the auto damper 30 is always fixed at an "open" position, so that the atmosphere of the cup 4 is always evacuated from the exhaust port 25 formed at the lower portion of the cup. With this mechanism, mist and particles formed of the scattered resist solution and solvent are discharged and prevented from depositing again on the wafer W. It is therefore possible to prevent contamination of the wafer W with the scattered mist and particles.

Furthermore, during the resist solution coating process, the temperature of the cup is set at the same temperature (e.g. 23° C.) of a clean room and the humidity is always set at 40% by a temperature/humidity controller (not shown). Due to this, it is possible to suppress difference in film thickness between wafers.

Figure 7D:
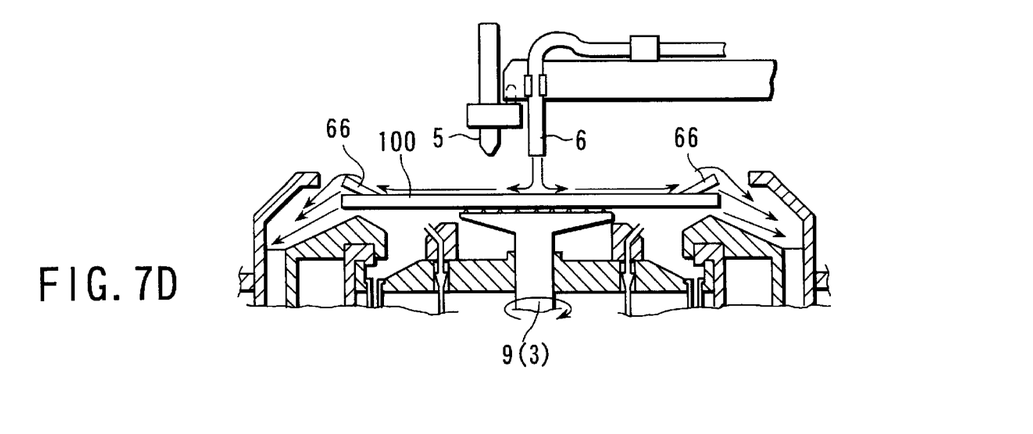

(4) Washing Process of the cup (Steps S12–S17: FIG. 7D)

In the step S11, if the determination is made to go to the washing step, the steps S12 to S17 are carried out.

In the cup washing step, the control unit 15 takes out the cup washing condition data 47 in accordance with the resist solution employed from the data storage section 45 (Step S12). Then, the washing control plate 100 is taken out from the storage unit 102 and transferred by the main arm mechanism 7 through the transfer passage 60. Since a temperature and humidity controlled down-flow passes through the transfer passage 60, the washing control plate 100 is set at almost the same temperature as that of the wafer W before subjecting to the resist coating process (Step S13).

In this way, the washing control plate 100 is set at the same processing conditions as in the wafer W. It is possible to maintain the temperature of the spin chuck 9 similar to that during a resist solution coating process. More specifically, when the temperature of the washing control plate 100 is lower than that of the wafer W, the spin chuck 9 is cooled. In this case, if the wafer W is held again, the in-plain temperature of the wafer W becomes nonuniform. As a result, the in-plain thickness of the resist film becomes nonuniform. However, in this embodiment, the temperature of the washing control plate 100 is controlled in the same manner as in the wafer W. Therefore, it is possible to efficiently prevent the aforementioned phenomena.

Subsequently, the washing control plate 100 is mounted on the spin chuck 9. Then, the motor 10 is actuated by the control unit 15 on the basis of the cup washing conditions 47, thereby rotating the washing control plate 100 at, for example, 4000 rpm. Subsequently, the control valve 44 is operated based upon the washing conditions 47 to supply the solvent onto the washing control plate 100 at a predetermined rate, that it, a predetermined ml per minute, for predetermined time (Step S14, FIG. 7D).

Thereafter, the solvent is scattered from the edge portion of the washing control plate 100, as shown in FIGS. 5 and 7D. The scattered solvent is directly blown to an inner wall of the cup 4 (outer cup 21), to dissolve and remove the attached resist solution.

The solvent-sprayed position varies depending upon a rotation number of the washing control plate 100, in other words, centrifugal force. More specifically, if a low rotation number is set, the solvent can be directly blown to a lower portion of the outer cup 21. If a high rotation number is set, the solvent can be directly blown to a higher portion of the outer cup 21.

In this embodiment, the rotation number of the washing control plate 100 is gradually increased to 2000 rpm, so that the washing is started from a lower portion of the outer cup 21 and applied to a higher position thereof while moving a solvent spray nozzle to the higher position (Step S15).

After the washing of the cup 4 is completed, the supply of the solvent is terminated and the solvent is shaken off. In this way, the cup washing step is terminated (Step S16). The washing control plate 100 used herein is unloaded from the spin chuck 9, passed through the transfer passage 60 having the temperature controlled down-flow DF passing therethrough, and stored into the storage unit 102.

According to the resist solution coating apparatus thus constructed and the cut washing step, the following effects can be obtained.

First, a common supply system is shared by the solvent supply system used in the prewet process and the solvent supply system used in the cup washing process, so that the layout of the solvent supply pipe cannot be complicated. Note that the cup washing apparatus used in a conventional resist solution coating apparatus requires a specific piping system exclusively for supplying the solvent for cup washing. Due to the specific piping, the structure of the apparatus is inevitably complicated. As mentioned above, not only the structure of the apparatus is simplified but also the number of the steps is reduced since it is not necessary to position each of supply systems at a right place. The processing time can be reduced.

Second, both in the prewet processing and the cup washing step, solvent processing conditions are controlled depending upon the type of the resist solution. Therefore, the prewet processing can be performed depending upon the type of the resist solution. Simultaneously, the washing step can be efficiently performed depending upon the resist solution to be removed.

Figure 8:
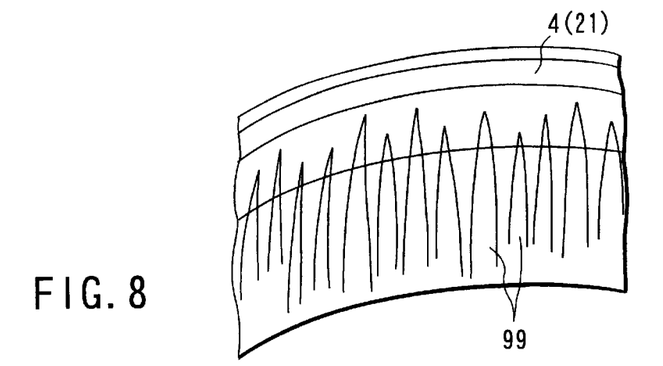
FIG. 8 is a schematic view of stain attached on an inner wall of the cup.

Third, since the range of the solvent to be scattered can be controlled by using the washing control plate 100. It is therefore possible to efficiently wash the cup. To be more specific, the fins 66 are formed in the washing control plate 100, so that the spreading direction of the solvent scattered from the washing control plate 100 can be purposely controlled. Particularly, the washing range in the vertical direction can be broadened. Furthermore, it is possible to freely control the solvent sprayed position by controlling the rotation number of the washing control plate 100. In this embodiment, the rotation of the washing control plate 100 is set at a low speed in the beginning and gradually raised to a high speed. When the solvent is sprayed firstly and directly to a higher position of the cup 4 in a conventional method, scattered liquid particles are not bound to each other and forms a bamboo blind. As a result, cleaning performance differs between the position to which the solvent is first attached and the position to which the solvent is not first attached. As a result, nonuniform washing 99 can be seen as shown in FIG. 8. In contrast, according to the present invention, nonuniform washing 99 can be efficiently prevented not only by scattering the solvent vertically in a wider range but also by moving the nozzle gradually from the bottom to the upper portion.

Figure 9:
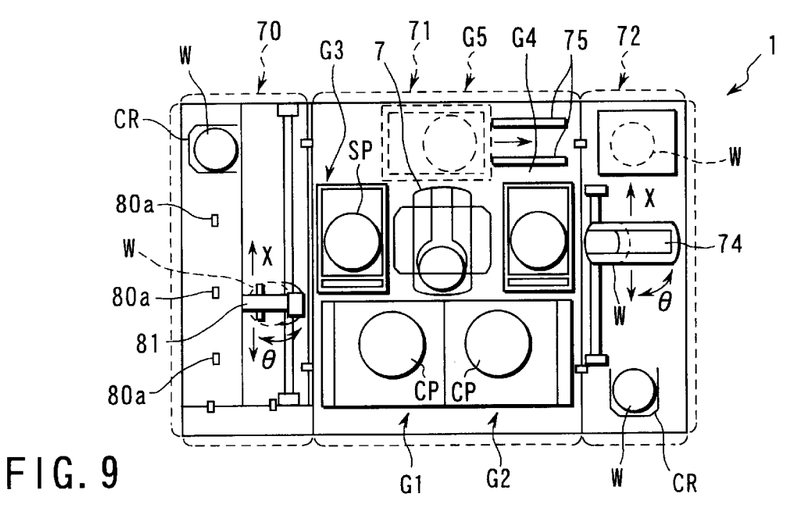
FIG. 9 is a plan view of a coating/developing system to which the apparatus of the present invention is applied.
Figure 10:
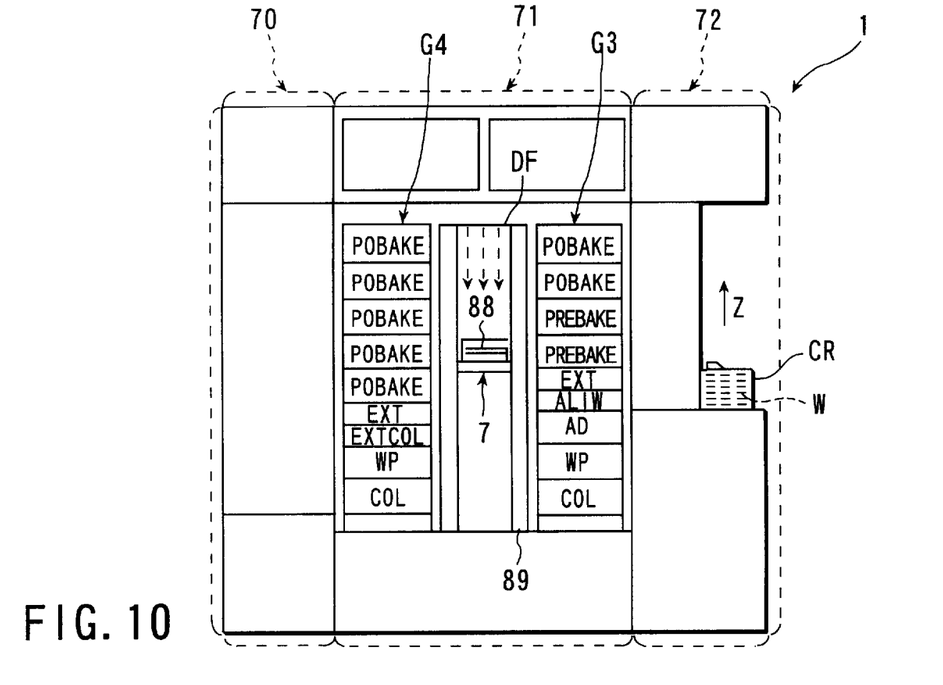
FIG. 10 is a back view of the coating/developing system to which the apparatus of the present invention is applied.
Figure 11:
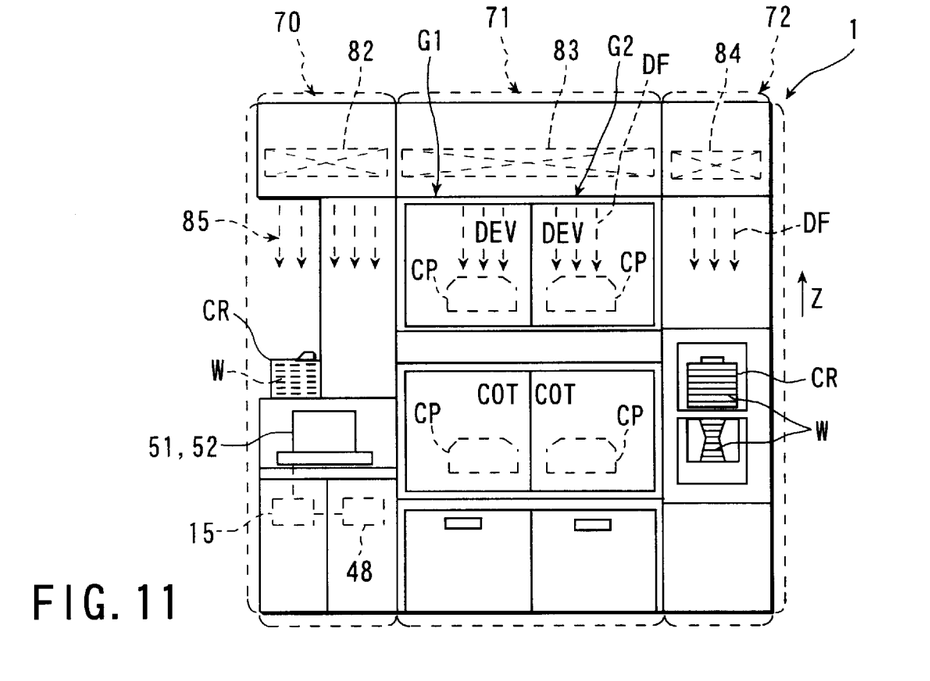
FIG. 11 is a front view of the coating/developing system to which the apparatus of the present invention is applied.

It is preferable that the resist solution coating apparatus explained above be applied to a coating/developing system shown in FIGS. 9–11.

As shown in FIG. 9, the coating/developing system has a cassette section 70, a process section 71, and an interface section 72. The cassette section is responsible for sequentially taking out the wafers W from a cassette CR storing the wafers W. The process section 71 is responsible for resist-coating and developing of the wafer W taken out by the cassette section 70. The interface section 72 is responsible for transferring the wafer W coated with the resist solution to a light-exposure unit (not shown).

The cassette section 70 has four projections 80a and a firs sub arm mechanism 81. The four projections 80a are used for positioning and holding the cassette CR. The first sub arm mechanism 81 takes out the wafer W from the cassette CR held by the projection 80a. After taking out the wafer W, the first sub arm mechanism 81 turns by an angle of θ to change the orientation thereof. In this manner, the wafer is transferred to the main arm mechanism 7 arranged in the process section 71.

The wafer W is transferred between the cassette section 70 and the process section 71 via a third process unit group G3. The third process unit group G3 is constituted by stacking a plurality of process units one upon top of another. More specifically, the process unit group G3 consists of a cooling unit (COL), a washing substrate storage unit 102, an adhesion unit (AD), an alignment unit (ALIM), an extension unit (EXT) two prebaking units (PREBAKE), and two post baking units (POBAKE) stacked in the order from the bottom.

The cooling unit (COL) cools wafer W. The washing substrate storage unit 102 stores the washing control plate 100. The adhesion unit (AD) renders the surface of the wafer W hydrophobic in order to increase fixing properties of the resist solution to the wafer W. The alignment unit (ALIM) aligns the wafer W. The extension unit (EXT) permits the wafer W to stand-by. Two prebaking units (PREBAKE) are used for heating the wafer before light exposure. The two post baking units (POBAKE) are used for heating the wafer after light exposure.

The wafer W is transferred to the main arm mechanism 7 by way of the extension unit (EXT) and the alignment unit (ALIM).

Furthermore, as shown in FIG. 9, first to fifth process unit groups G1 to G5 including a third process unit G3 are arranged around the main arm mechanism 7 so as to surround it. In other process unit groups G1, G2, G4 and G5, various process units are stacked vertically in multiple stages in the same manner as in the third process unit group G3.

The resist coating unit (COT) of the present invention is arranged in the first and second process unit groups G1, G2 as shown in FIG. 11. In the first and second process unit groups G1, G2, the resist coating unit (COT) and the developing unit (DEV) are stacked vertically in multiple stages.

Note that the fifth process unit group G5 is selectively arranged and constituted in the same structure as the fourth process unit group G4. The fifth process unit group G5 can be moved on a rail 75, so that maintenance treatment can be easily applied to the main arm mechanism 7 and the process unit groups G1 to G4.

In the FIG. 11, filters 82, 83, and 84 are indicated. The filters remove dusts to thereby clean a down-flow 85 in each station of the cassette section 70, the process section 71 and the interface section 72.

The main arm mechanism 7 is constituted of a cylindrical guide 89 pressed in a vertical direction and a main arm 88 movable up and down along the guide 89. The main arm 88 can be rotated horizontally and moved back and forth. The wafer W gains access to any one of the process unit groups G1 to G5 by moving the main arm 88 in a vertical direction.

Now, we will explain how to operate the system.

The wafer W taken out from the resist solution coating unit (COT) is loaded into the prebaking unit (PREBAKE) and dried by distilling a solvent (thinner) from the resist solution.

After cooled in the cooling unit (COL), the wafer W is transferred to a second sub arm mechanism 74 arranged in the interface section 72 via the extension unit (EXT).

Upon receiving the wafer, the second sub arm mechanism 74 loads the wafer W into the cassette CR in a successive manner. The interface section 72 transfers the wafers W stored in the cassette CR to the light exposure unit and receives the cassette CR storing wafers after light exposure.

Conversely, the wafer W after light exposure is transferred to the main arm mechanism 7 by way of the fourth process unit group 4. The main arm mechanism 7 loads the wafer W into the post baking unit (POBAKE) if necessary, and thereafter loads into a developing unit (DEV) to develop the wafer W. After the development, the wafer W is transferred to any one of baking units. After heated to dry, the wafer is unloaded to the cassette section 70 via the extension unit (EXT) of the third process unit group G3.

When the cup is washed, the washing control plate 100 is taken out from the storage unit 102 and supplied to the resist solution coating unit (COT).

Furthermore, the display portion 51 and the touch panel 52 (connected to the central processing unit 15) are arranged at a side portion of the cassette 70 as shown in FIG. 11.

In the case where the resist solution coating unit described above is applied to coating/developing unit shown in FIGS. 9–11, a plurality of wafers can be processed simultaneously. It is therefore possible to coat and develop the resist film of the wafer extremely efficiently. Furthermore, the process units are stacked one on top another. It is therefore possible to significantly reduce the footprint of the apparatus.

Next, variously modified embodiments of the present invention will be explained.

In a first modified example, a solvent may be supplied not only from the nozzle 6 but also from the back rinse nozzle 16, when the cup is washed. In this case, the solvent is supplied under the condition in accordance with the resist solution to be removed by controlling the air source 39 (which is connected to control valve 18 of the back rinse nozzle 16) by the control unit 15 on the basis of the cup washing conditions 47. If so, the solvent can be scattered from the edge portion of the washing control plate 100 by centrifugal force. Furthermore, since the solvent can be supplied from the lower surface side of the washing control plate 100 to the upper surface side through an opening 66a in this constitution, the solvent is guided along the lower surface of the fin 66 and scattered from the edge of the fin 66. It is therefore possible to merge the solvent scattered from the upper surface side of the fin 66 and the solvent scattered from the lower surface side thereof.

Furthermore, the solvent flowing along the upper surface side of the washing control plate 100 does not collide with the opening 66a, so that the solvent cannot be changed into mist. Therefore, it is possible to use the solvent very efficiently. In addition, it is possible to reduce requisite time and consumption of the solvent during the cup washing process. In this case, the solvent from the nozzle 6 and the solvent from the back rinse nozzle 16 may be supplied at different time points. The scatter direction of the solvent can be controlled by the time-lag supply manner.

Figure 12:
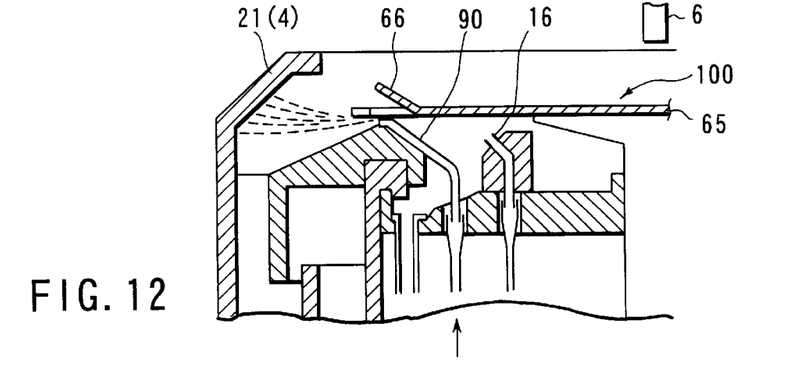
FIG. 12 is a cross sectional view partly showing an apparatus having the washing control plate according to another embodiment.

As a second modified embodiment, a plurality of spray nozzles 90 may be provided outside the back rinse nozzle 16 so as to spray the misty solvent from the nozzle to an upper inner wall of the inner cup 21, as shown in FIG. 12. Note that the solvent must be sprayed from the spray nozzle 90 before the washing control plate 100 is rotated. According to the washing method mentioned above, it is possible to moisten the whole entire surface of the cup 4 with the solvent. Therefore non-uniform washing as shown in FIG. 8 can be effectively prevented.

The misty solvent is likely to be sprayed from the spray nozzle 90 above the cup 4. To prevent this effectively, it is better that the amount discharged from the exhaust port 25 is set at a larger value than that in the cases where the resist solution is coated or where washing is performed by using the nozzle 6.

In the aforementioned embodiment, thinner is used as the washing liquid. Another solvent capable of dissolving the resist may be used as the washing liquid. The process liquid is not limited to the resist solution and a developing solution may be used. When the developing solution is used as the process liquid, pure water may be used as the solvent.

When the cup is washed, evaporation of the solvent may be suppressed by setting the temperature of the inner atmosphere of the cup at a lower value than that during the substrate processing time and increasing the humidity. Furthermore, if the pressure, temperature and humidity are controlled together, the cup can be washed more effectively. As a result, the processing time and the consumption of the solvent can be reduced.

The resist solution may be supplied at the same time the solvent is supplied. If the resist solution is supplied simultaneously with the solvent, the processing time can be reduced.

The temperature of the washing control plate 100 may be controlled by introducing the temperature-controlled down flow into the plate storage unit 102. Alternatively, the temperature of the washing control plate 100 may be controlled by mounting the washing control plate 100 on the cooling plate (COL).

Furthermore, the solvent may be supplied to the washing control plate 100 only from the lower surface side thereof.

The fins 66 arranged along the circumference of the washing control plate 100 may differ in height. The height of the fin 66 may be set depending upon which part of the cup 4 is stained. More specifically, when a higher part of the cup 4 is mostly stained, the height of the fin 66 is preferably set at a high value. Conversely, a lower portion of the cup 4 is mostly stained, the height of the fin 66 is preferably set at a low value.

Alternatively, if a plurality of (N number of) stains are attached from the bottom to the top of the cup, it is preferable that N types of fins 66 different in height be prepared to deal with the stains.

Furthermore, in place of the projections 14 arranged between the washing control plate 100 and the spin chuck 9, a porous sheet may be interposed.

Alternatively, if the inner surface of the cup 21 is washed by supplying the solvent to the washing control plate 100 while the spin chuck 79 is moved up by the cylinder 13, a wider space of the inner surface can be washed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for processing a substrate by supplying a process liquid to a substrate to be processed in a photolithography, comprising
    a cup;
    a washing control plate for washing an inner surface of the cup;
    a spin chuck for rotating the washing control plate or the substrate while holding the washing control plate or the substrate substantially horizontally in the cup;
    a solvent supply mechanism for supplying a solvent capable of dissolving the process liquid, onto the washing control plate or the substrate held by the spin chuck;
    a process liquid supply mechanism for supplying the process liquid onto the substrate held by the spin chuck; and
    a control section for selecting either a solvent to be supplied to the substrate or a solvent to be supplied to the washing control plate and controlling the solvent supply mechanism in accordance with the solvent selected.

2. The apparatus according to claim 1, wherein the control section has a supply-condition data storing portion for storing data of supply conditions of the solvents to the substrate and the washing control plate; and the control section controls the solvent supply mechanism on the bases of each of the supply-condition data stored in the supply condition data storing portion.

3. The apparatus according to claim 2, wherein the supply conditions for the solvent to be supplied to the washing control plate are determined in consideration of the process liquid.

4. The apparatus according to claim 1, wherein the solvent supply mechanism has a solvent supply source, and a solvent feeding mechanism connected to the control section which controls a supply amount and/or supply time of the solvent from the supply source.

5. The apparatus according to claim 1, wherein the solvent supply mechanism has an upper surface side supply system for supplying the solvent toward an upper surface of the washing control plate and a lower surface side supply system for supplying the solvent toward the lower surface of the washing control plate; and the control section controls so as to supply the solvent to the washing control plate by at least one of the upper surface side supply system and the lower surface side supply system.

6. The apparatus according to claim 1, wherein the solvent supply mechanism has a solvent supply system for supplying the solvent to at least one of the upper and lower surfaces of the washing control plate, and a solvent spray system for supplying a misty solvent toward an inner surface of the cup; and the control section supplies the misty solvent to an inner surface of the cup from the solvent spray system and thereafter supplies the solvent from the solvent supply system while the washing control plate is rotated.

7. The apparatus according to claim 1, further comprising an atmosphere control mechanism for controlling an atmosphere of the cup, the atmosphere control mechanism being selectively controlled by the control section during a pre-processing time, processing time and a cup washing time.

8. The apparatus according to claim 1, wherein the control section changes a rotation speed of the spin chuck to change a solvent supply position to the cup from the washing control plate.

9. The apparatus according to claim 1, further comprising a transfer mechanism for transferring the washing control plate onto the spin chuck.

10. The apparatus according to claim 1, wherein the washing control plate further comprises a solvent guiding portion for scattering the solvent.

11. The apparatus according to claim 10, wherein the solvent guiding portion has a guiding piece which is formed by partly cutting a peripheral portion of the washing control plate to make an incision and raising up the incision.

12. The apparatus according to claim 10, wherein the solvent guiding portion has a guiding passage for guiding the solvent from a surface to which the solvent is supplied to an opposite surface thereof.

13. The apparatus according to claim 1, further comprising a substrate temperature control mechanism for setting temperatures of the washing control plate and the substrate substantially the same.

14. The apparatus according to claim 1, wherein the spin chuck adsorbs and holds the washing control plate or the substrate at a predetermined distance therebetween.

15. A method of processing a substrate by supplying a process liquid to the substrate in a cup in a photolithography, comprising the steps of:

(a) permitting the substrate to be held on a spin chuck arranged in the cup;

(b) moistening the substrate with the solvent by supplying a solvent onto the substrate by a solvent supply system while the substrate is rotated by the spin chuck;

(c) forming a film of a process liquid on the substrate by supplying the process liquid onto the substrate while the substrate is rotated by the spin chuck;

(d) removing the substrate from the spin chuck and mounting a washing control plate onto the spin chuck; and (e) supplying the solvent onto the washing control plate by using the same solvent supply system as in the step (b) while the washing control plate is rotated by the spin chuck to distribute and scatter the solvent from the washing control plate toward an inner surface of the cup, thereby removing an attached material from the inner surface of the cup.

16. The method according to claim 15, wherein, in the step (e), another solvent supply system is used which differs from the solvent supply system used in the step (b).

17. The method according to claim 15, wherein, before the step (e), a misty solvent is sprayed to the inner surface of the cup.

18. The method according to claim 15, wherein, in the step (e), a rotation speed of the spin chuck is varied to control a distance and direction of the solvent scattering from the washing control plate.

19. The method according to claim 15, wherein, in the step (e), the spin chuck is moved up and down to control a distance and direction of the solvent scattering from the washing control plate.

* * * * *